(12) United States Patent
Zhou et al.

(10) Patent No.: US 6,531,860 B1
(45) Date of Patent: Mar. 11, 2003

(54) INTEGRATED POWER DETECTOR WITH TEMPERATURE COMPENSATION

(75) Inventors: Jianjun Zhou, San Diego, CA (US); Jonathan Klaren, San Diego, CA (US); Charles J. Persico, Rancho Santa Fe, CA (US)

(73) Assignee: Qualcomm Inc., San Diego, CA (US)

( * ) Notice: Subject to any disclaimer, the term of this patent is extended or adjusted under 35 U.S.C. 154(b) by 0 days.

(21) Appl. No.: 09/882,443

(22) Filed: Jun. 14, 2001

(51) Int. Cl.[7] ................................................ G01R 1/44
(52) U.S. Cl. ........................ 324/105; 324/133; 324/431
(58) Field of Search ......................... 324/95, 600, 72.5, 324/760, 648, 721, 431, 441, 508, 516, 771, 133; 323/369, 907; 322/40; 368/203; 762/61, 60, 44; 714/14, 22, 36

(56) References Cited

U.S. PATENT DOCUMENTS 4,970,456 A * 11/1990 Holcomb ..................... 324/95
5,621,307 A * 4/1997 Beggs ......................... 324/313
6,373,236 B1 * 4/2002 Lemay ........................ 324/95

* cited by examiner

Primary Examiner—Kamand Cuneo
Assistant Examiner—Trung Nguyen
(74) Attorney, Agent, or Firm—Philip R. Wadsworth; Charles D. Brown; Howard H. Seo

(57) ABSTRACT

A power detector (50) detects a power level of an amplified signal (S20) produced by a power amplifier (16) on the same integrated circuit (100). The power detector compensates for an effect of temperature variations on the magnitude of the detected power level.

20 Claims, 11 Drawing Sheets

INTEGRATED POWER DETECTOR WITH TEMPERATURE COMPENSATION

BACKGROUND

1. Field of the Invention

The invention relates to detecting a level of an amplified signal. More particularly, the invention relates to detecting signal levels in a communications transmitter or receiver.

2. Background Information

A power detector is a circuit that receives a time-varying voltage as an input signal and outputs an indication of the power level of the input signal. For example, a power detector may output a DC voltage signal that has a voltage level proportional to the power of the input signal. A power detector may be used to detect the highest peak value or all peak values of the input signal.

Power detectors are often used to monitor power amplifier outputs. One common use of power detectors is to facilitate gain adjustments in automatic gain control amplifiers. A power detector used in this capacity monitors the signal outputted by the amplifier and indicates the power level. The power level indication is used to adjust the amplifier's gain accordingly. Such control may help to minimize the effects of undesirable changes in the amplifier's output signal level.

One area in which power detector circuits are particularly useful is in the field of wireless communications. For example, a power detector may be used in a code-division multiple-access (CDMA) wireless phone system to ensure that the maximum transmitting power requirements are not exceeded. During transmission, the power detector converts the output power of a transmitting power amplifier into a DC voltage, which may be used by other circuits to determine and/or adjust the transmitting power.

In practice, power detector circuits are used in a number of different capacities and are available in a variety of different configurations. One method of power detection uses the nonlinear characteristics of a PN junction diode to detect the peak voltage values of an input signal. Unfortunately, this method produces inaccurate output results because the diode characteristics are highly sensitive to temperature variations. Even minor changes in the power detector's operating environment may have a significant impact on the accuracy of its output. Consequently, for a certain input signal power, changes in the operating temperature of a power detector's circuit may alter its output signal by up to 50% or more. Stated differently, a single input signal having a known input voltage level will produce output signals having significantly different voltage levels depending upon the temperature of the power detector circuit.

FIG. 1 is a diagram of a RF transmitter section 2 that may be fabricated on a circuit board for use in a wireless communications device (e.g. a cellular telephone). Transmitter section 2 includes a discrete power detector circuit 4, a power amplifier 6, and an antenna 8. An output of the power amplifier 6 is applied to an input of the discrete power detector 4 through resistor-capacitor (RC) coupling. Diode D1 detects a power level of the input signal, and the discrete power detector circuit 4 provides an output based on this indication at terminal Vout. Diode D2, which is identical to diode D1, provides some measure of compensation for the temperature-varying response of diode D1.

In this example, power detector 4 is constructed from numerous discrete circuit components including resistors, capacitors, inductors, diodes, and an operational amplifier. The requirement of a large number of discrete components increases system assembly costs and may also prevent the use of such a detector in an environment where circuit board space is restricted. Because of the inductive and capacitive values required by such a circuit, integration of discrete power detector 4 is not feasible. Additionally, this discrete method of power detection often requires additional temperature compensation and sophisticated calibration and software to obtain the accuracy and dynamic range needed for an application.

As stated above, power detector circuits are commonly used to monitor the output signal levels of power amplifiers. However, discrete power detectors require a large number of discrete components on the circuit board and therefore increase the system cost. In addition, existing power detectors demonstrate poor detection accuracy due to temperature variations and therefore require complicated calibration, also increasing the system cost. Additionally, the operating temperature of a power amplifier may be expected to vary over a range greater than 100° C. For such reasons, it has not been feasible to fabricate a power amplifier and a power detector on the same integrated circuit.

SUMMARY

Given the constraints of size in modern electronics components, there is a need for a power detector and a power amplifier formed on a single IC. Further, there is also a need for a power detector capable of compensating for the effects of temperature variations.

Consistent with the principles of the present invention as embodied and broadly described herein, an integrated circuit according to one embodiment of the invention includes a power amplifier and a power detector coupled to the power amplifier. The power amplifier is configured and arranged to receive an input signal and to produce an amplified signal based on the input signal. The power detector is configured and arranged to detect a power level of the amplified signal. In this embodiment, the power detector is also configured and arranged to output a temperature-compensated indication of the power level. As described in particular embodiments as set forth herein, such temperature compensation may include receiving one or more compensation currents that are substantially proportional to absolute temperature at least over an operating temperature range of the integrated circuit.

BRIEF DESCRIPTION OF THE DRAWINGS

The accompanying drawings, which are incorporated in and constitute a part of this specification, illustrate preferred embodiments of the invention and, together with the description, explain the objects, advantages, and principles of the invention. In the drawings.

DETAILED DESCRIPTION

The following detailed description refers to the accompanying drawings that illustrate exemplary embodiments consistent with the present invention. Other embodiments are possible and modifications may be made to the embodiments without departing from the spirit and scope of this invention. Therefore, the following detailed description is not meant to limit the invention solely to the embodiments described.

Figure 1:
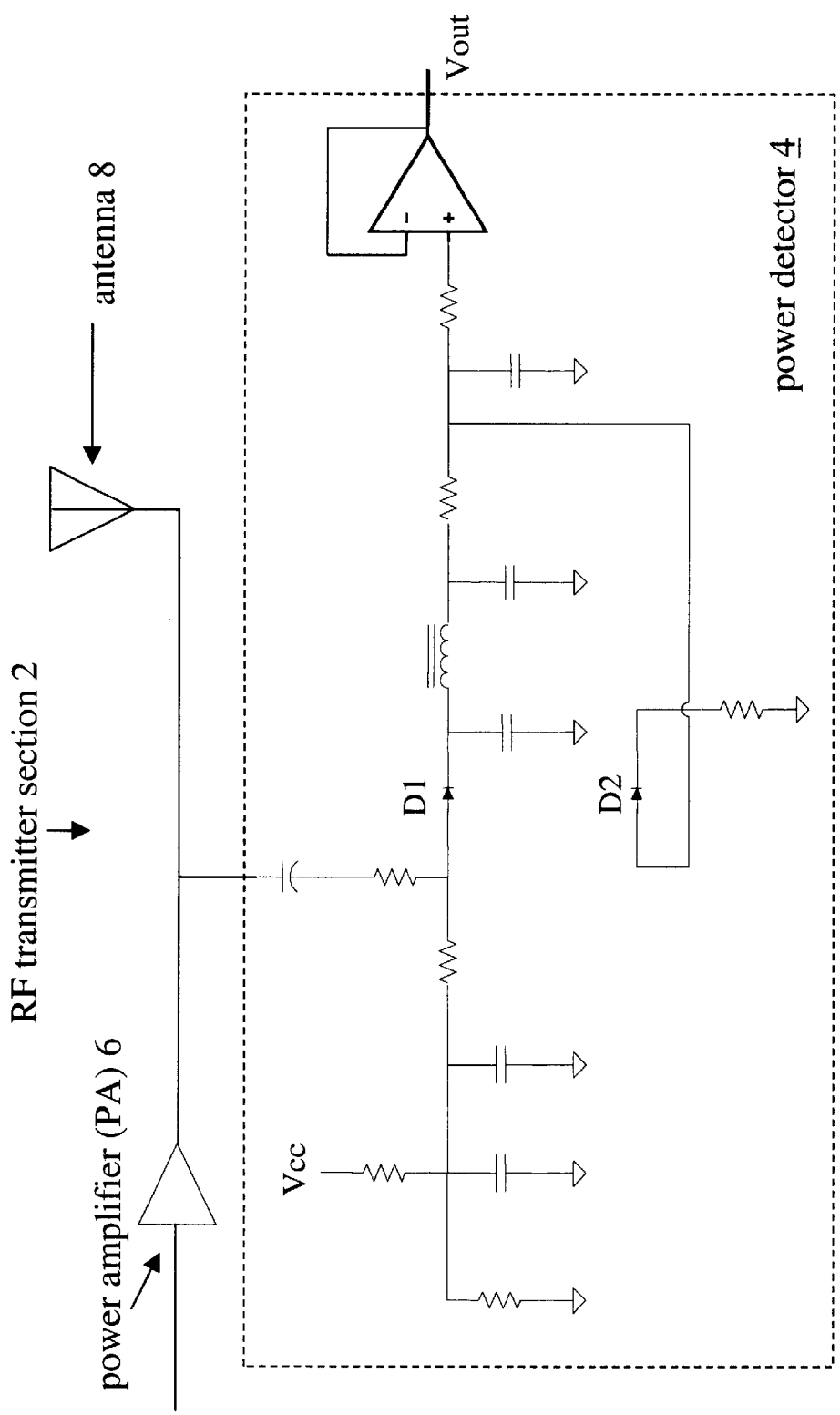
FIG. 1 is a diagram of a RF transmitter section including a power amplifier and a discrete power detector circuit.
Figure 2:
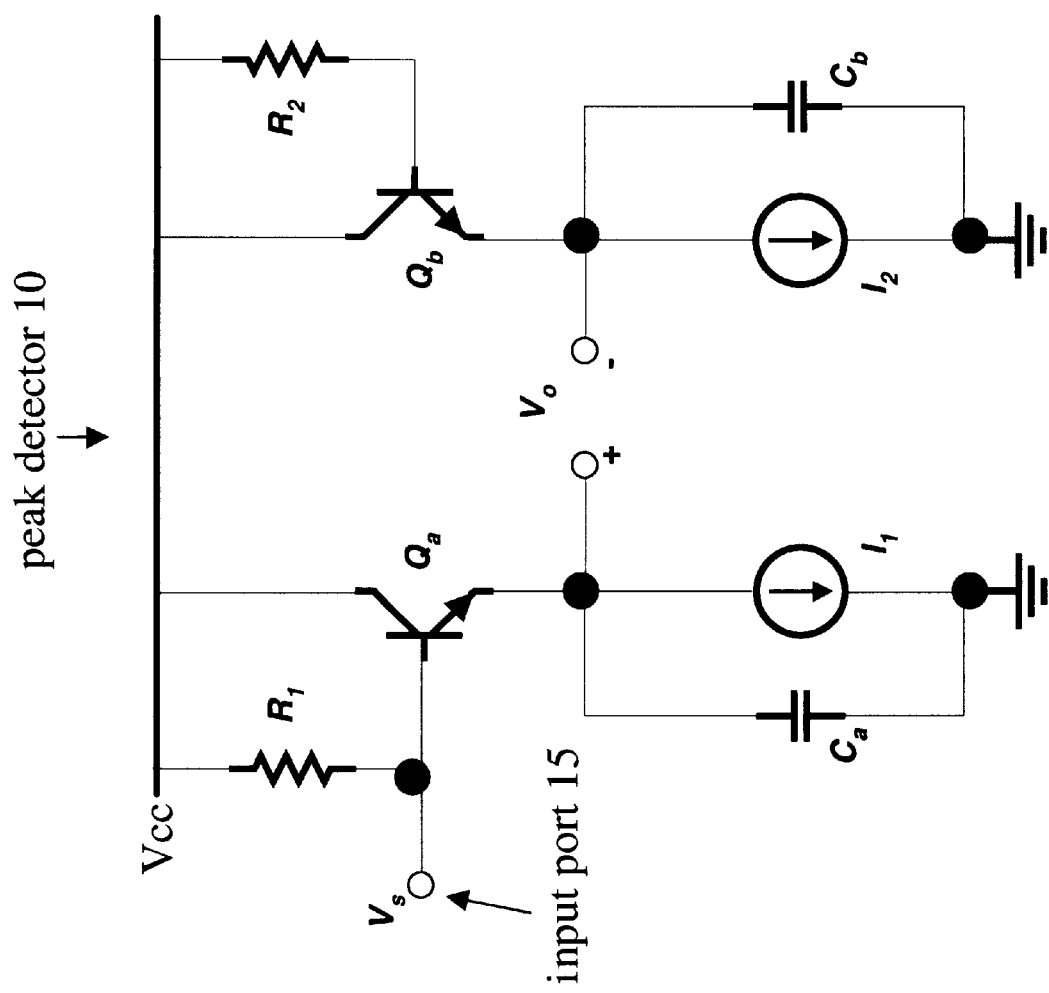
FIG. 2 is a schematic diagram of a RF peak detector circuit.

FIG. 2 is a schematic diagram of a RF peak detector circuit. In the operation of this circuit, a sinusoidal input signal Vs is received at an input port 15. The base-emitter junction of a bipolar junction transistor (BJT) Qa functions as a nonlinear rectifying element on the input signal Vs, thus converting the input sinusoidal signal Vs into a DC voltage signal. A current source I1 is provided, along with a hold capacitor Ca and a bias resistor R1. A BJT Qb, current source I2, and bias resistor R2 respectively match Qa, I1, and R1, providing a reference to ensure that an output voltage Vo is zero when no signal is received at the input port 15. Information regarding the theory of operation of such a peak detector may be found in "Low-power Monolithic RF Peak Detector Analysis" by Robert G. Meyer, *IEEE Journal of Solid-State Circuits*, January 1995, pp. 65–67.

A peak detector as shown in FIG. 2, which provides instantaneous peak values, has an inherently wideband operation and low power consumption. A relation between the degree of droop over time and the values of I1 and Ca may be expressed as $$dVo/dt = -I1/Ca \text{ or } \Delta Vo = -I1\Delta t/Ca,$$

where Δt may be chosen to be approximately half of the period of the input signal Vs. While capacitor Cb may be matched to capacitor Ca, capacitor Cb acts to filter noise (e.g. as introduced by a power supply over Vcc and/or ground) from the reference potential, and its value may be chosen to suit a particular application or environment. If no power supply noise is expected, for example, capacitor Cb may be omitted.

Unlike the discrete power detector circuit 4, the peak detector circuit of FIG. 2 is realizable in monolithic form. However, this circuit does not compensate for temperature variations in environment. Therefore, under significant temperature variations (e.g. as experienced during the operation of a power amplifier), this circuit will produce a range (in some cases, a wide range) of output voltages at Vo in response to an input signal applied to input port 15 and having a predetermined voltage level.

Figure 3:
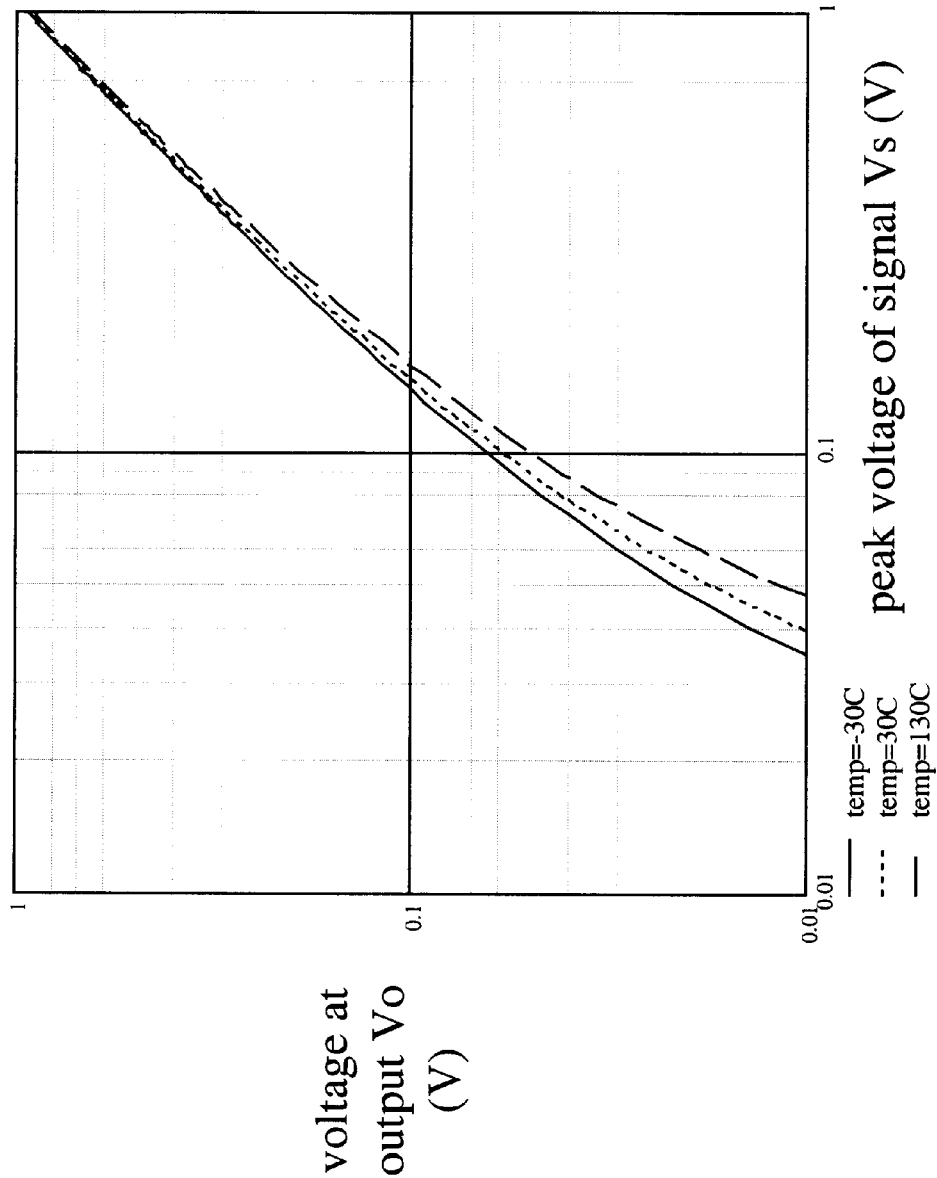
FIG. 3 graphically depicts the effects of temperature upon the relationship between input signal voltage and output signal voltage of the peak detector of FIG. 2.

FIG. 3 illustrates the effect of variations in temperature on the output voltage level of the peak detector of FIG. 2. For example, FIG. 3 shows that an input sinusoidal signal with a peak value of 0.05 volt (V) Will produce an output (DC) signal of about 0.023 V at an operating temperature of −30° Celsius (C). However, the same 0.05 V input signal will produce an output signal of about 0.017 V at 30°, and about 0.012 V at 130°. Therefore, temperature variations may cause a significant difference in the response of such a peak detector.

Figure 4:
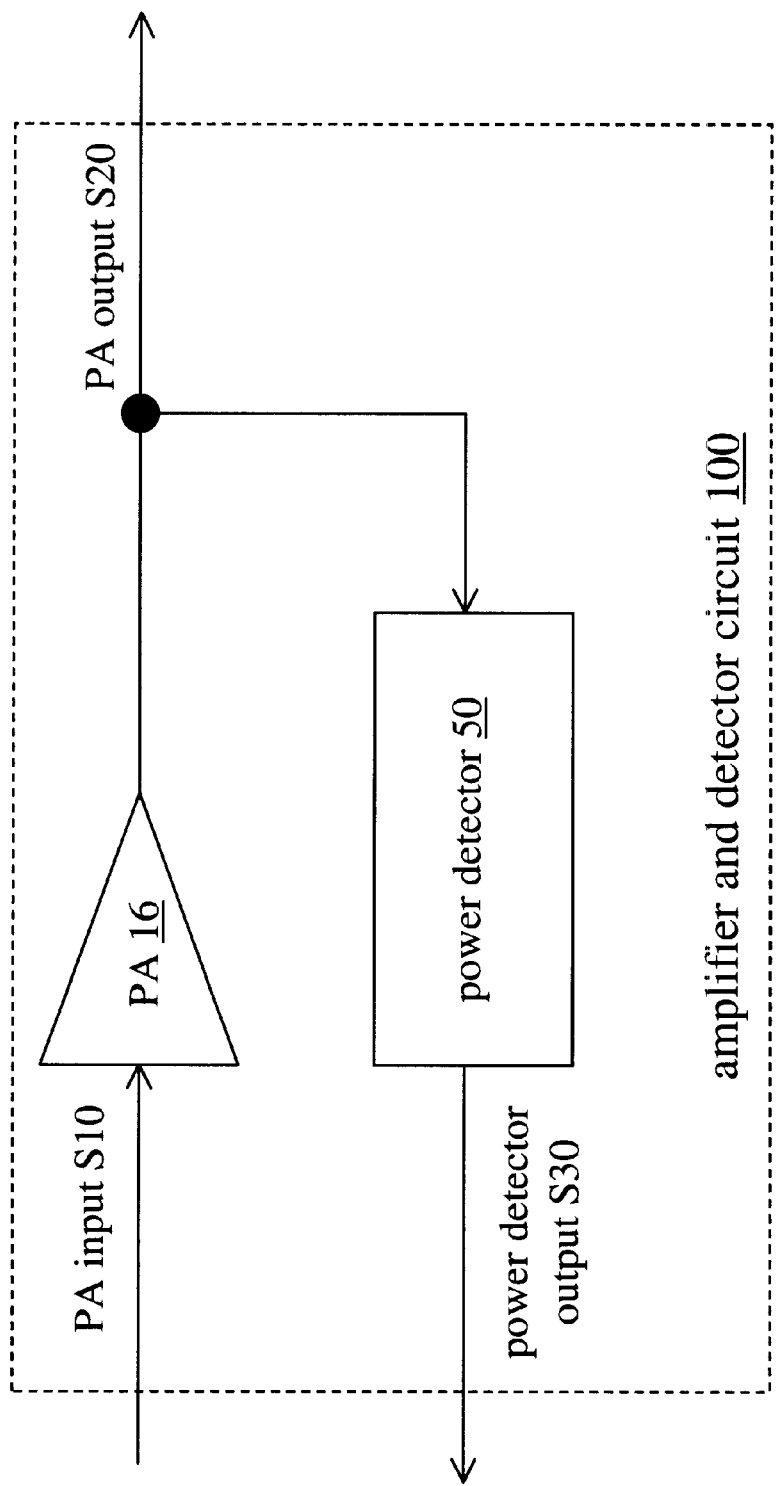
FIG. 4 is a block diagram of an amplifier and detector circuit according to an embodiment of the present invention.

FIG. 4 illustrates a block diagram of an amplifier and detector circuit 100 according to an embodiment of the invention. In an exemplary implementation, circuit 100 is fabricated on a single integrated circuit, although in other implementations power amplifier (PA) 16 and power detector 50 may be fabricated as separate devices. Efficiencies of a single packaging arrangement will help in further reducing power consumption and the number of overall components required for the circuit.

Figure 5:
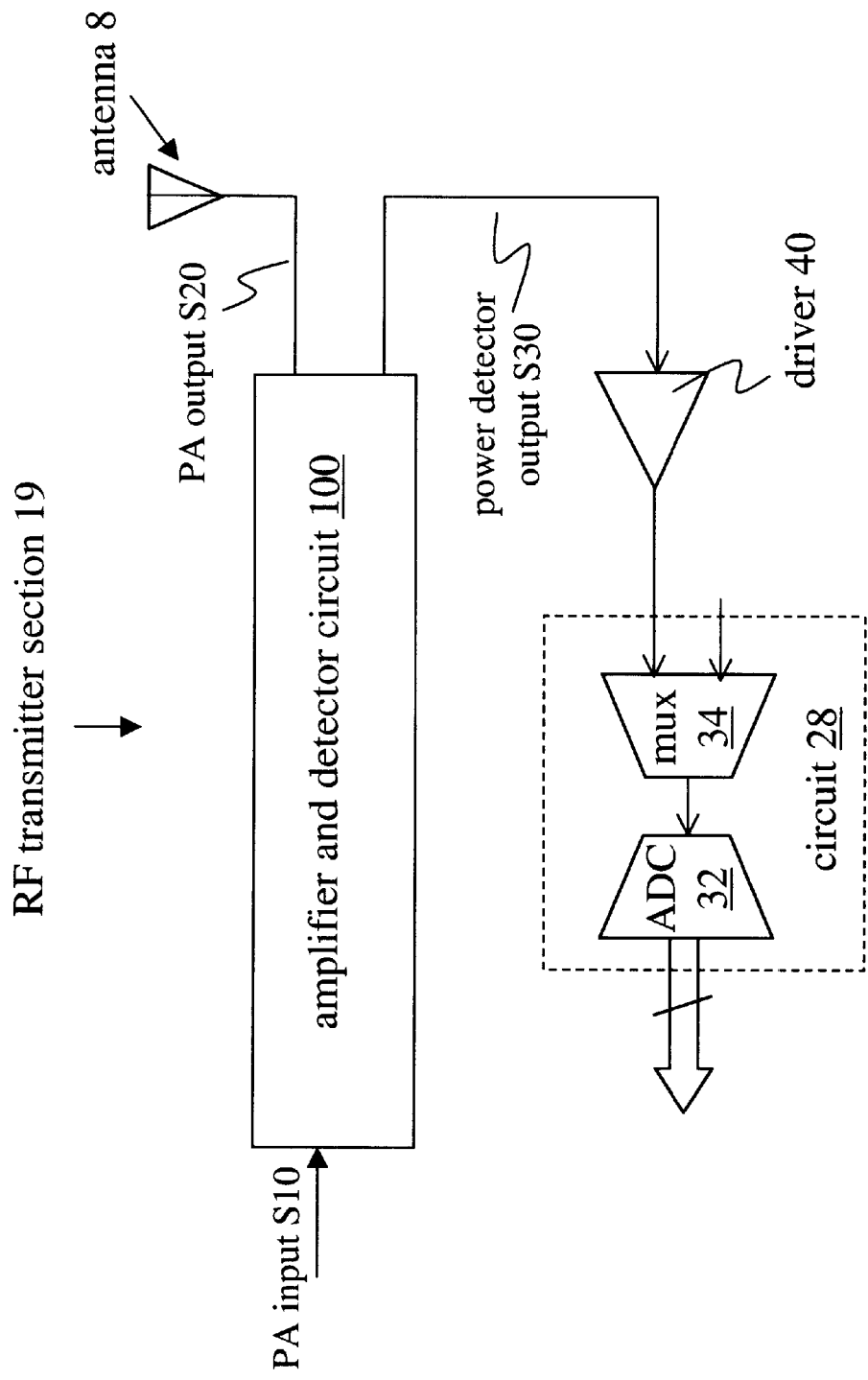
FIG. 5 is a block diagram of a RF transmitter section including an amplifier and detector circuit according to an embodiment of the invention.

FIG. 5 is a diagram of a RF transmitter section 19 that includes amplifier and detector circuit 100. Circuit 100 receives a PA input signal S10 (e.g. an input time-varying voltage signal) and produces a PA output signal S20 (e.g. an amplified time-varying signal) as an output. The amplified signal S20 is forwarded to an antenna 8 for wireless transmission.

As shown in FIG. 4, PA output signal S20 is also inputted to power detector 50, which detects voltage peaks in amplified time-varying signal S20 and converts those peaks into a DC voltage output signal S30. Output signal S30, which may be buffered by a driver 40 as shown, may then be used for automatic gain control and/or other transmitter system housekeeping functions. (Driver 40 may also be used to modify the bandwidth of the power detector. For example, driver 40 may include a low-pass filter.) As in the particular implementation shown, output signal S30 may be multiplexed with one or more other signals [e.g. by multiplexer (mux) 34] and/or converted to a digital signal [e.g. by analog-to-digital converter (ADC) 32] by a circuit 28 before being applied to a control function. Driver 40 may be fabricated on the same integrated circuit as amplifier and detector circuit 100, on the same integrated circuit as circuit 28, or as a separate device. In another implementation, circuits 100 and 28; or all three of circuits 100, 40, and 28; may be fabricated on the same integrated circuit.

Integration of power amplifier 16 and power detector 50 reduces the overall power consumption and the external component count of RF transmitter section 19, thereby reducing its overall cost. Power detector 50 also achieves better detection accuracy than prior art detectors over temperature variations in transmitter section 19 (the particular implementation shown provides superior accuracy over the range of −30° C. to 130° C.). Such widely varying temperatures can have a significant impact on the accuracy of the output signals produced by prior art power detectors.

Figure 6:
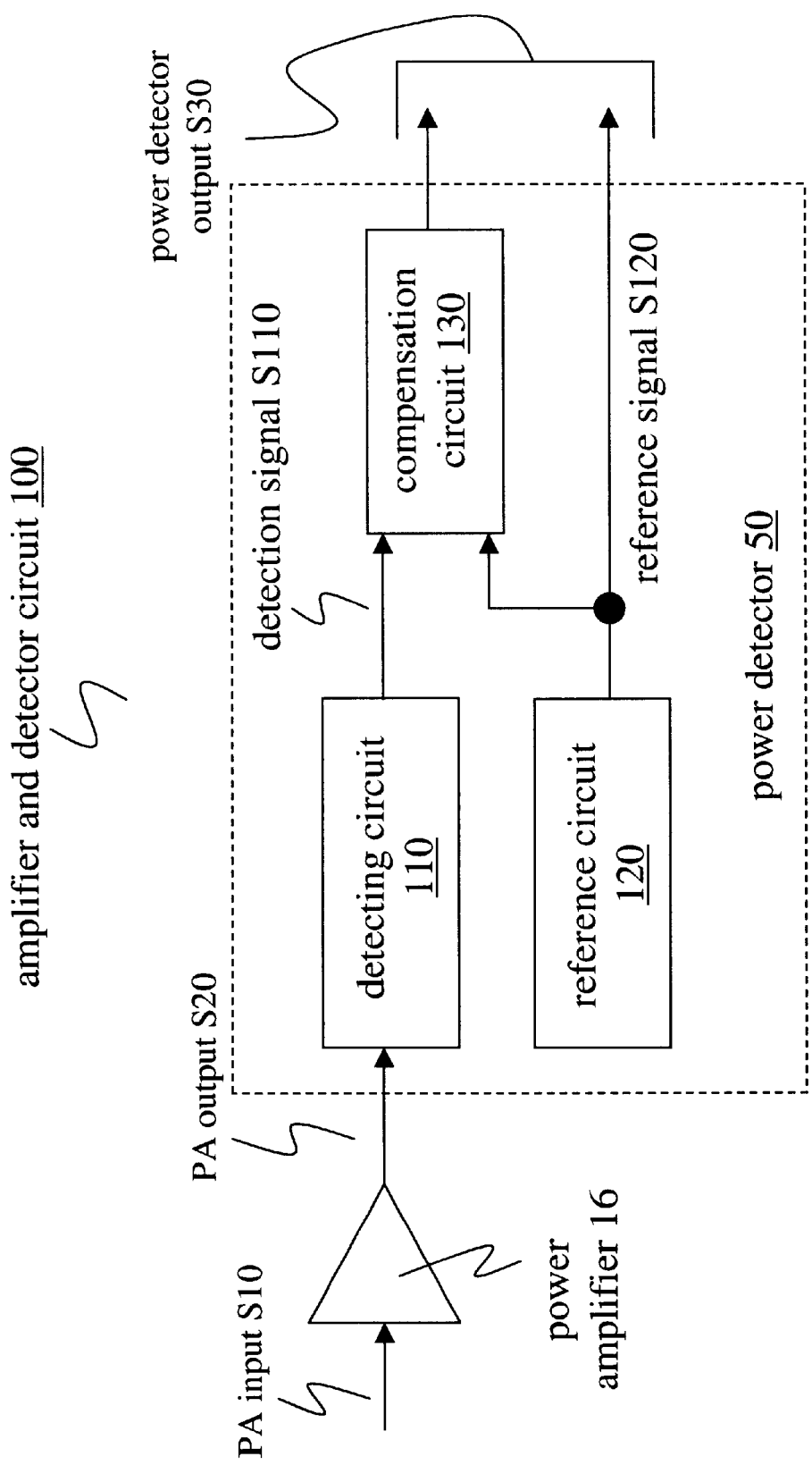
FIG. 6 is a block diagram of an amplifier and detector circuit according to an embodiment of the present invention.

FIG. 6 shows a block diagram of an implementation of power detector 50 of amplifier and detector circuit 100. In this implementation, a detecting circuit 100 receives PA output signal S20 and outputs a detection signal S110. A reference circuit 120 outputs a reference signal S120. Detection and reference signals S110 and S120 are inputted to compensation circuit 130. A power detector output signal S30 is defined by a voltage between the output of compensation circuit 130 and reference signal S120.

Figure 7:
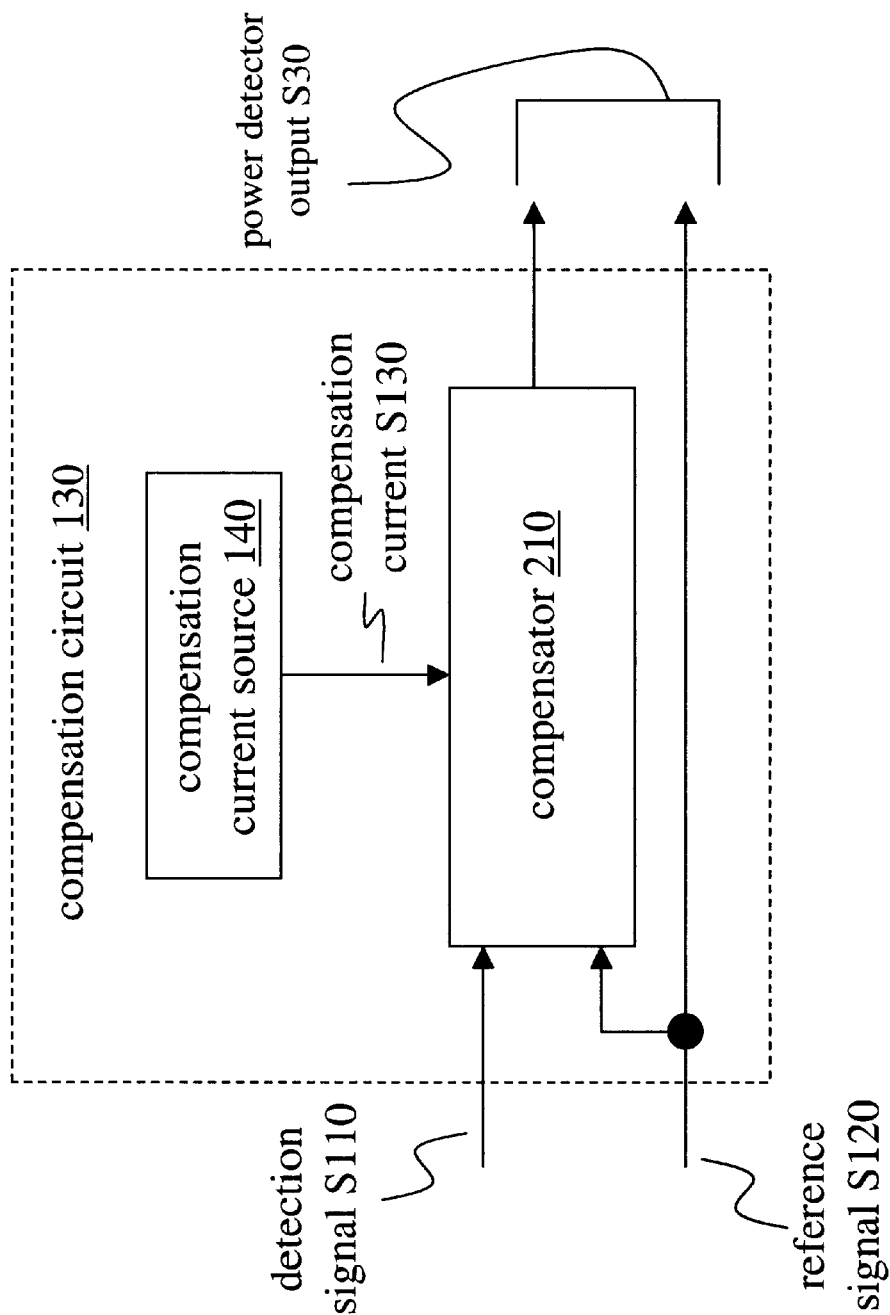
FIG. 7 is a block diagram of a compensation circuit.

FIG. 7 shows a block diagram of an implementation of compensation circuit 130. A compensator 210 receives detection signal S110 and reference signal S120. From compensation current source 140, compensator 210 also receives a compensation current signal S130. A power detector output signal S30 is defined by a voltage between the output of compensator 210 and reference signal S120.

Figure 8:
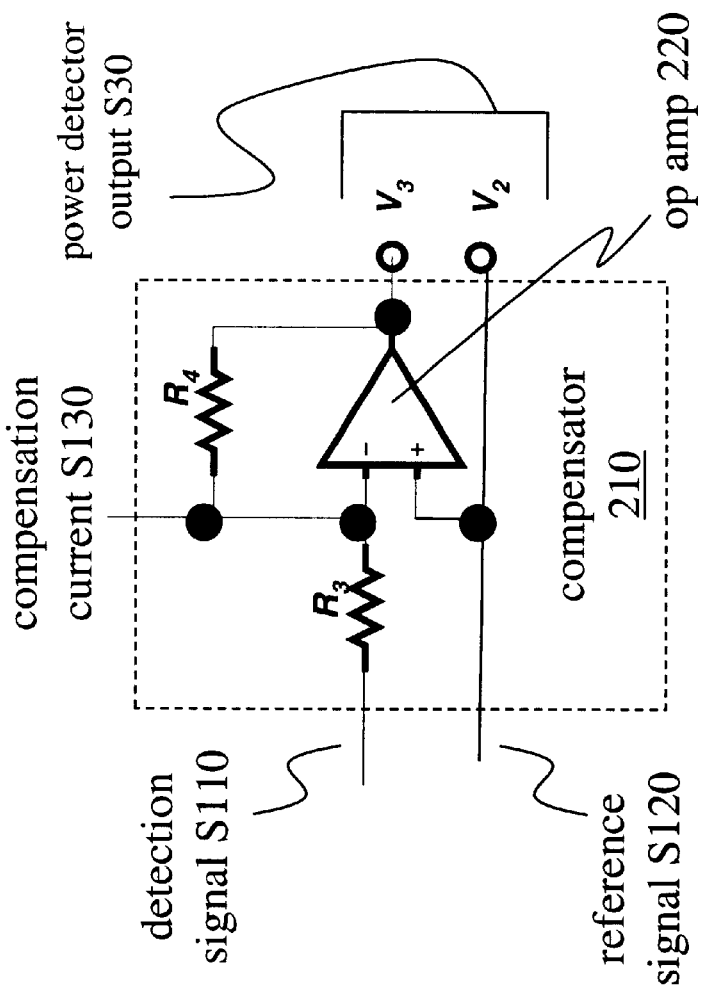
FIG. 8 is a schematic diagram of an inverting amplifier.

FIG. 8 shows a schematic diagram of one implementation of compensator 210. In this implementation, an operational amplifier (op amp) 220 is configured as a buffer (in this instance, an inverting amplifier). In this particular implementation, the inverting amplifier is configured for unity gain (i.e. R3 and R4 are equal resistances), although other resistive ratios may be selected in other implementations. Additionally, compensation current S130 is inputted to the inverting input terminal of op amp 220.

Figure 9:
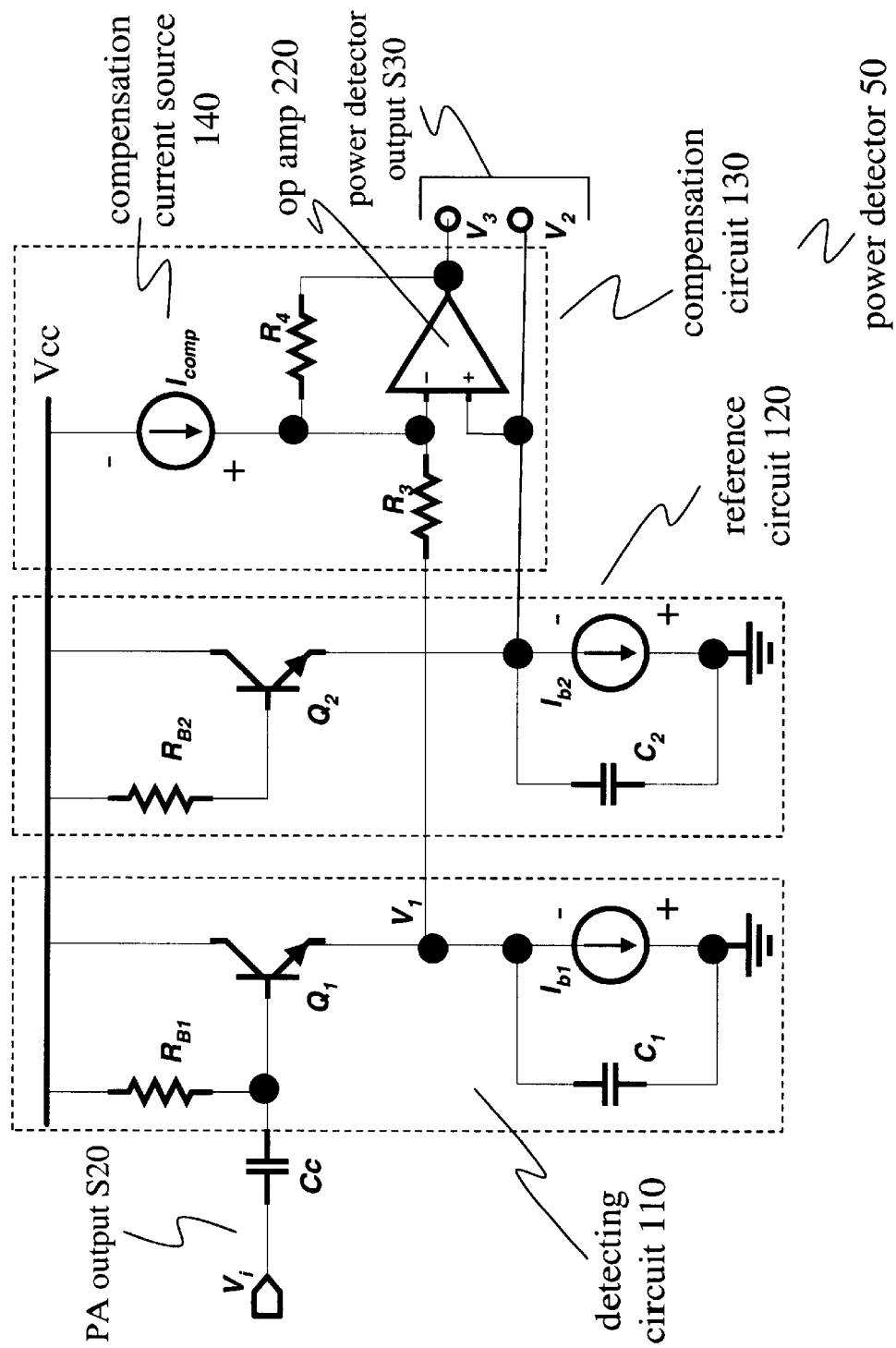
FIG. 9 is a schematic diagram of a power detector 50 according to an embodiment of the invention.

FIG. 9 is a schematic diagram of one implementation of power detector 50. Input port Vi receives PA output signal S20, which passes through an AC coupling capacitor Cc to detecting circuit 110. Detecting circuit 110 includes a bias resistor R(B1), a current source I(b1), a hold capacitor C1, and a BJT Q1. The base-emitter junction of BJT Q1 functions as a nonlinear rectifying element on the input signal S20, thus converting the time-varying input signal into a DC voltage signal. Current source I(b1) may be implemented with a BJT of a field-effect transistor (FET). The elements R(B2), I(b2), C2, and Q2 of reference circuit 120 match the respective elements of detecting circuit 110, and reference circuit 120 provides a reference to ensure that a null voltage is presented between detection signal S110 and reference signal S120 when no peaks are detected on PA output signal S20.

During operation of the implementation of power detector 50 as shown in FIG. 9, the time-varying signal S20 is received at the input port Vi. Capacitor C1 is charged through transistor Q1 when Q1 is on and discharged through current source I(b1) when Q1 is off. Reference circuit 120 establishes a reference voltage V2 on reference signal S120 as an offset for the voltage V1 across capacitor C1 so that the difference between V1 and V2 is proportional to the peak voltage value $V_p$ of input signal S20. If the input signal 20 is sinusoidal, then $$V1-V2=V_p-V_T \ln \sqrt{(2\pi V_p/V_T)} \qquad (1)$$

where $V_T=kT/q$ with T denoting the temperature in degrees Kelvin (K), k denoting Boltzmann's constant ($1.38\times10^{-23}$ Joule/K), and q denoting the charge of an electron ($1.602\times10^{-19}$ Coulomb). As can be seen from the above equation, the output signal (V1−V2) is temperature-dependent and hence the output accuracy is affected by temperature variations. In this implementation of power detector 50, compensation circuit 130 injects a proportional to absolute temperature (PTAT) current into compensator 210 to minimize these temperature-induced inaccuracies.

With the aforementioned temperature compensation, assuming a sinusoidal input signal S20 with a peak voltage $V_p$, the voltage Vout on power detector output signal S30 may be expressed as:

$$Vout=V2-V3=[V_p31\ V_T \ln \sqrt{(2\pi V_p/V_T)}]+(Icomp \times R4) \qquad (2)$$

where V3 is the voltage on the output signal of compensator 210. As the desired output is $V_p$, it is desirable to choose Icomp such that $$Icomp=[V_T \ln \sqrt{(2\pi V_p/V_T)}]/R4 \qquad (3)$$

in order to minimize the temperature-dependent error.

Figure 10:
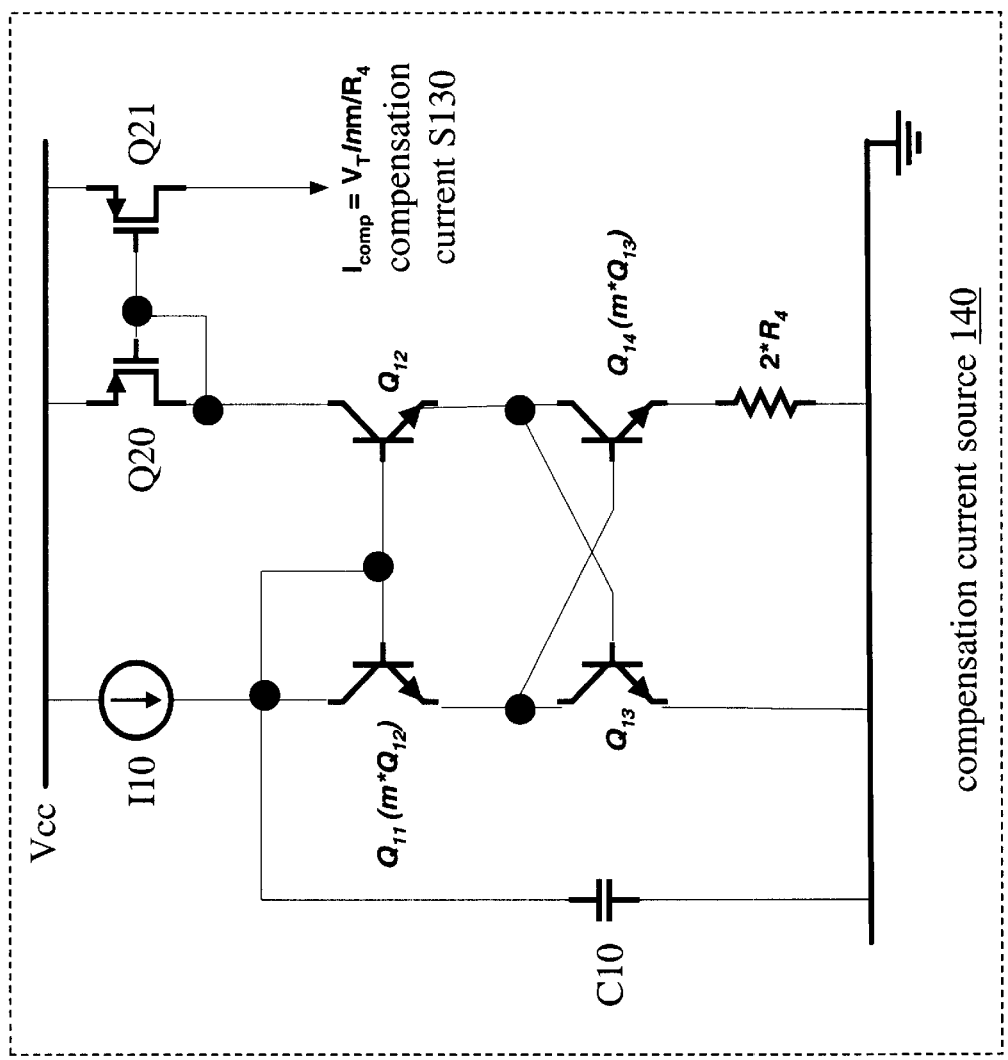
FIG. 10 is a schematic diagram of a compensation current source.

FIG. 10 illustrates an example of a PTAT current generator that may be used as compensation current source 140 to generate compensation current S130. This circuit includes a capacitor C10, a current source I10, four BJTs Q11–Q14, two FETs Q20 and Q21, and a resistor having the value (2×R4). Current source I10 may be implemented using a transistor (e.g. a PMOS FET having its gate tied to ground). Field effect transistors Q20 and Q21 act as a current inverter, producing compensation current signal S130 by reversing the direction of the collector current of BJT Q12.

In practice, PTAT current generators are designed to accommodate the requirements of a specific application. The PTAT current Icomp (and hence the temperature compensation behavior of power detector 50) may be adjusted by changing a scaling factor m. In the circuit of FIG. 10, the factor m defines a relationship between the current densities of Q11 and Q12 (and between the collector current densities of Q14 and Q13). In other words, $J_{C(Q11)}=m\times J_{C(Q12)}$, and $J_{C(Q14)}=m\times J_{C(Q13)}$. In one method of implementation, the transistors Q11 and Q12 (and Q14 and Q13) may be fabricated such that the ratio of their emitter areas is equal to the factor m. In another method of implementation, the transistors Q11 and Q14 may be fabricated as m individual instances of the transistors Q12 and Q13, respectively.

Scaling factor m may be chosen in accordance with the expected dynamic range of input signal S20 (i.e. of peak signal $V_p$) for optimized temperature compensation and high output accuracy (by way of example, an expected dynamic range for a cellular telephone transmitter is about 30 dB). For instance, the factor m may generally be chosen to be a larger number for higher voltage level input signals and a smaller number for lower voltage level input signals. If $Icomp=(V_T \ln m)/R4$, then $$Vout=V_p-V_T \ln \sqrt{(2\pi m^2 V_p/V_T)} \qquad (4)$$

Thus, by carefully selecting the scaling factor m for a given input signal power range, the output error $V_T \ln \sqrt{(2\pi m^2 V_p/V_T)}$ can be significantly reduced. As an example, the extent of this error reduction is illustrated in FIG. 11.

Figure 11:
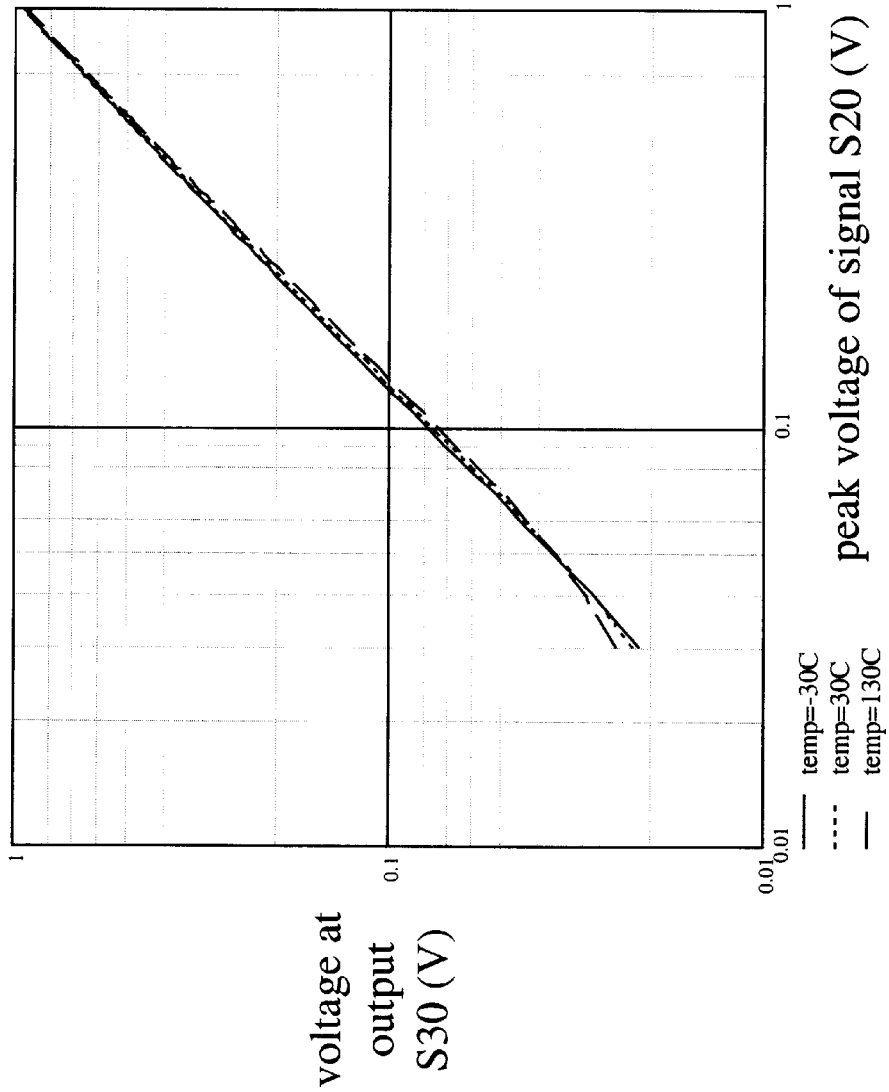
FIG. 11 graphically depicts the effects of temperature upon the relationship between input signal voltage and output signal voltage of one implementation of power detector 50.

FIG. 11 shows that when using the implementation of power detector 50 shown in FIG. 9, the amount of error due to temperature variations in an output signal resulting from a particular input signal power is significantly reduced. When compared with the relationships shown in FIG. 3, the voltage variation in an output signal of the same signal level over the range of −30° C. to 130° C. is significantly reduced. In this example, the factor m is equal to 2.

Compensation current source 140 need not be implemented according to FIG. 10, so long as the error term in Equation 4 above is sufficiently minimized for the particular application. A PTAT generator may be fabricated in CMOS instead, for example, and other more complicated PTAT circuits may also be used. In a particular implementation of amplifier and detector circuit 100, a PTAT generator may already be available for use as compensation current source 140. For example, power amplifier 16 may include a bandgap generator to provide a bias current, and bandgap generators are commonly based on PTAT generators. In practicing the invention, therefore, it may be possible to use a circuit used elsewhere as compensation current source 140.

It may be desirable to choose the factor m for optimum error reduction at a particular temperature or input signal range. Alternatively, it may be desirable to choose the factor m for multipoint compensation (i.e. for optimum error reduction across a range of temperatures or input signal ranges). In a further implementation, several different instances of compensation current source 140 may be implemented, with the sources being switchable into and out of compensation circuit 130 according to their predetermined suitability for a particular operating temperature and/or a particular input signal level or range. Such an implementation may be used to increase accuracy over the range and/or to extend the useable range.

Although some emphasis has been placed on the invention's applicability to wireless transmission and wireless telephones, the present invention is applicable to any other transmission system where the detection of signal and or carrier power is necessary. Applications outside the transmission art are also contemplated, such as reception of radio transmissions. The invention may also be applied to other communications systems where temperature-compensable detection of a power level of an amplified signal may be desirable, such as reception of data transmissions over fiber optic communications links.

The foregoing presentation of the described embodiments provides an illustration and description sufficient to enable any person skilled in the art to make or use the present invention. This description is not intended to be exhaustive, and the invention is not limited to any precise form disclosed. Various modifications and variations are possible consistent with the above teachings or may be acquired from practice of the invention, and the generic principles presented herein may be applied to other embodiments as well. For example, other active devices such as FETs may be used in place of one or more of the BJTs in one embodiment of the invention, and compensation currents other than PTAT currents may be received by and/or generated within a power detector according to another embodiment of the invention. Thus, the present invention as recited in the claims appended hereto is to be accorded the widest scope consistent with the principles and novel features disclosed in any fashion herein.

What is claimed is:

1. An integrated circuit (100) comprising a power amplifier (16) configured and arranged to receive an input signal (S10) and to produce an amplified signal (S20) based on the input signal, characterized in that the integrated circuit further comprises:

a power detector (50) coupled to the power amplifier and configured and arranged to detect a power level of the amplified signal, wherein the power detector is further configured and arranged to output a temperature-compensated indication (S30) of the power level of the amplified signal and wherein the temperature-compensation indication comprises a compensation circuit that injects a proportional to absolute temperature (PTAP) current into a compensator which produces the temperature-compensation indication.

2. The integrated circuit according to claim 1, wherein the power detector is AC coupled to the power amplifier.

3. The integrated circuit according to claim 1, wherein the power detector comprises a detecting circuit (110) and a reference circuit (120).

4. The integrated circuit according to claim 3, wherein each among the detecting circuit and the reference circuit includes a nonlinear device, the two nonlinear devices (Q1 and Q2) being matched devices.

5. The integrated circuit according to claim 4, wherein the power detector further comprises a compensation circuit (130) configured and arranged to produce the temperature-compensated indication of the power level of the amplified signal.

6. The integrated circuit according to claim 5, wherein the compensation circuit comprises a buffer (210) configured and arranged to receive an output of the detecting circuit (S110) and a compensation current (S130) substantially proportional to absolute temperature over an operating temperature range of the integrated circuit.

7. The integrated circuit according to claim 5, wherein the compensation circuit comprises an operational amplifier (220).

8. The integrated circuit according to claim 5, wherein the wherein the power detector further comprises a compensation current source (140) configured and arranged to produce the compensation current.

9. The integrated circuit according to claim 5, wherein the compensation circuit receives a selected one of a plurality of compensation currents substantially proportional to absolute temperature over an operating temperature range of the integrated circuit.

10. The integrated circuit according to claim 9, wherein the wherein the power detector further comprises a plurality of compensation current sources configured and arranged to produce the plurality of compensation currents.

11. The integrated circuit according to claim 3, wherein the detecting circuit includes a nonlinear device (Q1).

12. The integrated circuit according to claim 11, wherein the nonlinear device has at least one PN junction.

13. A process of power detection comprising receiving an input signal and, within an integrated circuit (100), producing an amplified signal based on the input signal, characterized in that said process further comprises:

within the integrated circuit, detecting a power level of the amplified signal; and within the integrated circuit, producing a temperature-compensated indication of the power level of the amplified signal proportional to absolute temperature.

14. The process of power detection according to claim 13, wherein detecting a power level of the amplified signal includes applying the amplified signal to a nonlinear device.

15. The process of power detection according to claim 13, wherein producing a temperature-compensated indication of the power level of the amplified signal includes receiving a compensation current substantially proportional to absolute temperature over an operating temperature range of the integrated circuit.

16. The process of power detection according to claim 15, wherein producing a temperature-compensated indication of the power level of the amplified signal includes receiving a detection signal.

17. The process of power detection according to claim 15, said method further comprising, within the integrated circuit, generating the compensation current.

18. The process of power detection according to claim 13, wherein producing a temperature-compensated indication of the power level of the amplified signal includes selecting one among a plurality of compensation currents substantially proportional to absolute temperature over an operating temperature range of the integrated circuit.

19. A use of an integrated circuit (100) to output a temperature-compensated indication (S30) of the power level of an amplified signal, said integrated circuit comprising a power amplifier (16) configured and arranged to receive an input signal (S10) and to produce the amplified signal (S20) based on the input signal, characterized in that the integrated circuit further comprises:

a power detector (50) coupled to the power amplifier and configured and arranged to detect a power level of the amplified signal, wherein the power detector is further configured and arranged to output the temperature-compensated indication of the power level of the amplified signal and wherein the temperature-compensation indication comprises a compensation circuit that injects a proportional to absolute temperature (PTAP) current into a compensator which produces the temperature-compensation indication.

20. The use of an integrated circuit according to claim 19, wherein the power detector further comprises a compensation circuit (130) configured and arranged to receive a compensation current (S130) substantially proportional to absolute temperature over an operating temperature range of the integrated circuit and to produce the temperature-compensated indication of the power level of the amplified signal.

* * * * *